United States Patent [19]

Wada

[11] Patent Number: 4,692,785
[45] Date of Patent: Sep. 8, 1987

[54] INTEGRATED CIRCUIT DEVICE FOR WRITING AND READING INFORMATION

[75] Inventor: Masashi Wada, Yokohama, Japan

[73] Assignee: Tokyo Shibaura Denki Kabushiki Kaisha, Kawasaki, Japan

[21] Appl. No.: 263,252

[22] Filed: May 13, 1981

[30] Foreign Application Priority Data

May 19, 1980 [JP] Japan .................................. 55-66245

[51] Int. Cl.[4] .......................................... H01L 29/36
[52] U.S. Cl. ....................................... 357/52; 357/42; 357/23.1; 357/23.5
[58] Field of Search ............ 357/52 D, 52, 42, 23 VT, 357/23 GS, 23 D; 365/72, 207, 182

[56] References Cited

U.S. PATENT DOCUMENTS

| | | | |
|---|---|---|---|
| 3,955,210 | 5/1976 | Bhatia et al. ........................... | 357/42 |
| 4,149,176 | 4/1979 | Satou et al. . | |
| 4,152,717 | 5/1979 | Satou et al. . | |
| 4,167,747 | 9/1979 | Satou et al. . | |
| 4,327,368 | 4/1982 | Uchida ................................... | 357/42 |

FOREIGN PATENT DOCUMENTS 52-11874  1/1977  Japan ...................................... 357/42

Primary Examiner—Andrew J. James
Assistant Examiner—Jerome Jackson
Attorney, Agent, or Firm—Finnegan, Henderson, Farabow, Garrett & Dunner

[57] ABSTRACT

An integrated circuit device for writing and reading information comprising an array of plural non-volatile memory elements of insulated-gate field effect type formed on a semiconductor substrate of one conductivity type; plural sets of two complementary insulated-gate type field effect transistors of P-channel type and N-channel type formed on the substrate, which transistors constitute a control circuit for the memory elements; and a latch-up suppressant, comprising a long and narrow semiconductor region of the one conductivity type which has an impurity concentration higher than that of the substrate and is formed between the array and the control circuit in a surface region of the substrate, with a predetermined voltage applied directly to the semiconductor region.

4 Claims, 5 Drawing Figures

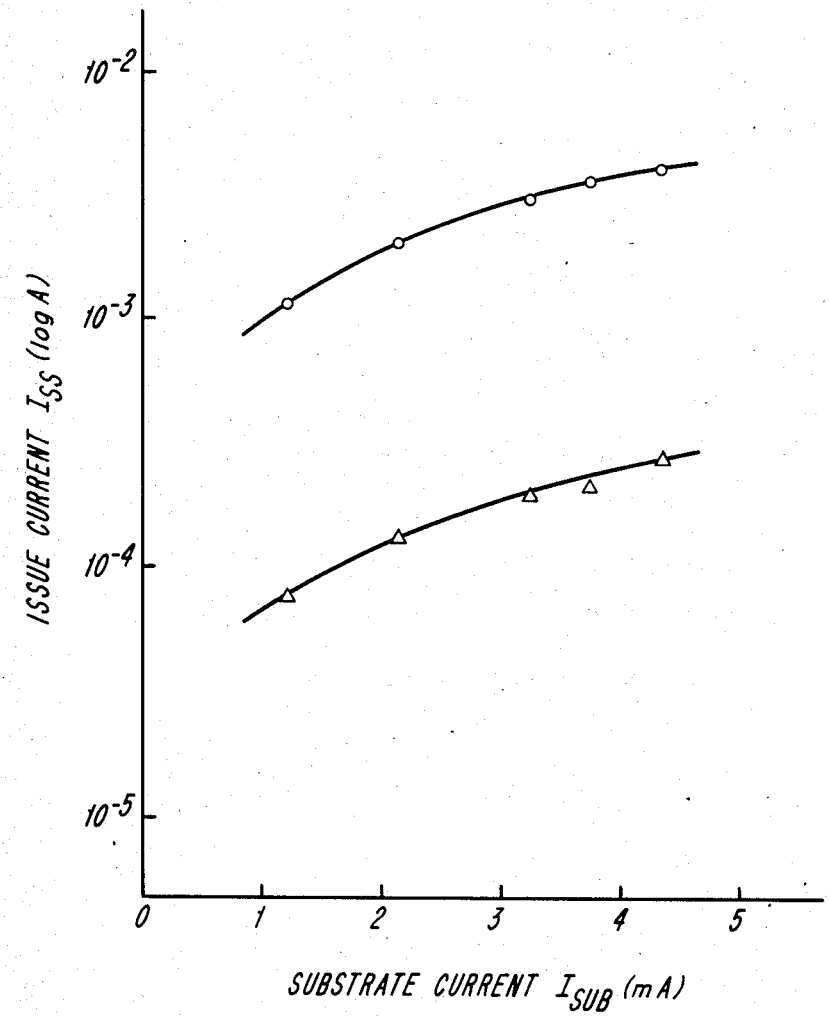

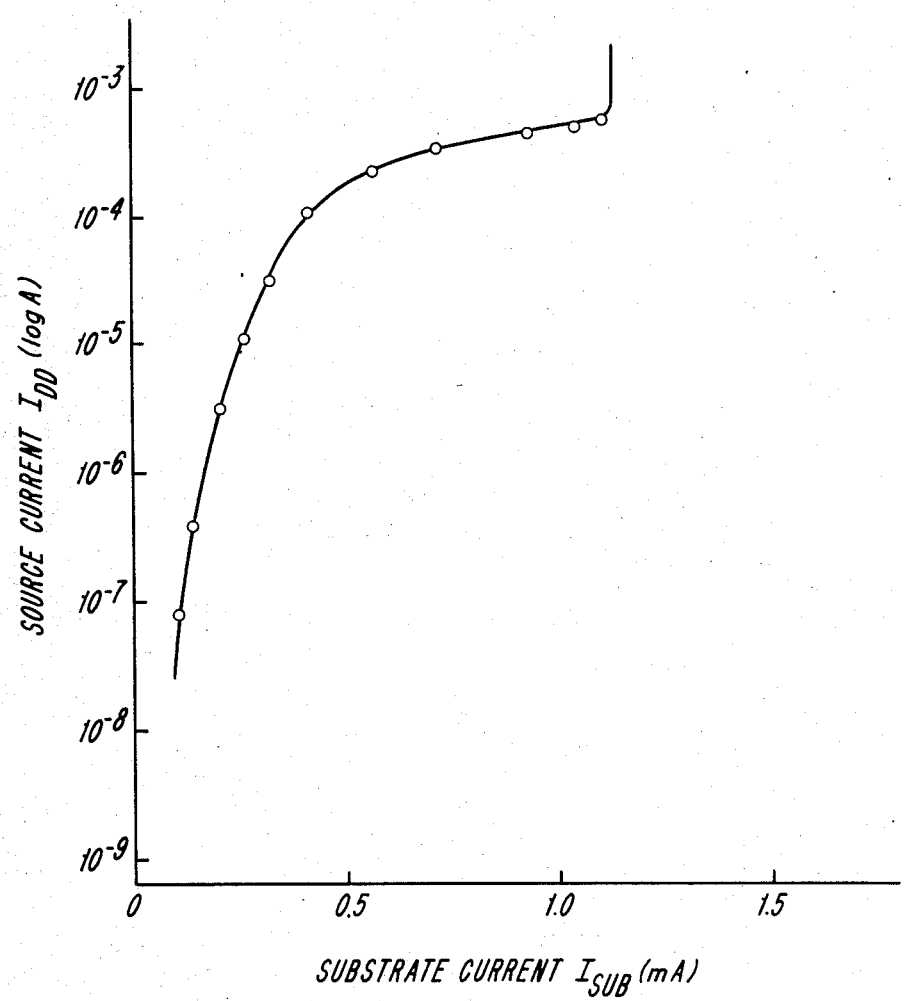

INTEGRATED CIRCUIT DEVICE FOR WRITING AND READING INFORMATION

BACKGROUND OF THE INVENTION

This invention relates to an integrated circuit device for writing and reading information, which device includes nonvolatile memory elements and a control circuit employing complementary insulated-gate type field effect transistors.

Insulated-gate type field effect transistors which have a SAMOS structure or a MNOS structure are well-known as nonvolatile memory elements. A large number of memory elements of these kinds are integrated on a semiconductor substrate in matrix format. A "1" or "0" is selectively written into each of the memory elements and is read out from the same by a control circuit formed therearound. It is preferable that such integrated memory circuits have a minimum power consumption in order to suppress heat production.

An integrated circuit device with a control circuit of complementary insulated-gate type field effect transistors (CMOS devices) for controlling non-volatile memory arrays, which may satisfy the above requirement, is disclosed in IEEE JOURNAL OF SOLID-STATE CIRCUITS, VOL. SC-13, No. 5, OCTOBER 1978, PP. 677-680.

As shown in the above article, known complementary insulated-gate type field effect transistors (CMOS devices) comprise an N-type semiconductor substrate, a P-type well region formed in the substrate, an N-channel MOS transistor formed on the well region and a P-channel MOS transistor formed on the substrate; wherein the gate electrodes of the N-channel and P-channel transistors are connected together, thereby constituting an input terminal. The drain regions of both transistors are connected together, thereby constituting an output terminal. When a predetermined voltage is applied between the source regions of both transistors, the CMOS device operates as an inverter.

The above-mentioned CMOS device has essentially a PNPN structure comprising the source of the P-channel MOS transistor, the N-type semiconductor substrate, the P-type well region and the source of the N-channel MOS transistor. It is possible for the PNPN structure to work as a thyristor. If so, then a circuit between the sources of the two transistors is short-circuited due to a noise signal being introduced into the PNPN structure, so that the control circuit of the CMOS devices may cause an errant behavior or may be broken in the worst case. This phenomenon, wherein a parasitic thyristor is wrongly turned on, is called "latch-up." This latch-up phenomenon can be essentially caused also in a case wherein both non-volatile memory elements and CMOS devices are formed together on the same semiconductor substrate.

Prevention of the latch-up phenomenon of CMOS devices is discussed in DENSHI TSUSHIN GAKKAI RONBUNSHI Vol. J61-C, Nov. 2, 1978, PP. 106-113. In this article, the following countermeasures for the latch-up phenomenon are shown. One of the countermeasures is to isolate electrically the P-channel MOS transistors and the N-channel MOS transistors by forming insulator layers therebetween. Another of the countermeasures is to cut off electric channels between the P-channel MOS transistors and the P-type well regions by forming P-type regions of a low impurity concentration therebetween.

Yet another of the countermeasures is to determine the mutual positional relation between the P-channel transistors and the N-channel transistors in order to prevent thyristor action of the CMOS devices. Yet another of the countermeasures is to determine the electric characteristics of the N-channel and P-channel transistors so as to prevent thyristor action of the CMOS devices. However these countermeasures bring inevitably lower integration density, more complicated manufacturing processes or deteriorated performance of the CMOS devices as inverters.

SUMMARY OF THE INVENTION

Accordingly, an object of the invention is to provide an integrated circuit device for writing and reading information using minimum power consumption.

Another object of the invention is to provide an integrated circuit device for writing and reading information including complementary insulated-gate type field effect transistors, which is free from the latch-up phenomenon.

A further object of the invention is to provide an integrated circuit device for writing and reading information, which has high integration density and superior inverter performance, of complementary insulated-gate type field effect transistors and which can be fabricated with ease.

These and other objects have been attained by an integrated circuit device for reading and writing information which comprises:

a semiconductor substrate of one conductivity type having at least one first semiconductor region of opposite conductivity type;

plural sets of two complementary insulated-gate type field effect transistors which constitute a control circuit for writing and reading information, one of the two transistors of each of the sets being of said one conductivity channel type including a first source region and a first drain region of said one conductivity type and formed spaced-apart from each other in the first semiconductor region, a first insulator layer formed on the first semiconductor region between the first source region and the first drain region, and a first gate electrode formed on the first insulator layer, the other of the two transistors of each of the sets being of said opposite conductivity channel type including a second source region and a second drain region of said opposite conductivity type, formed spaced-apart from each other in the semiconductor substrate, a second insulator layer formed on the substrate between the second source region and the second drain region, and a second gate electrode formed on the second insulator layer, wherein a predetermined voltage is applied between the first and second source regions of the two transistors of each set, the first and second gate electrodes are connected commonly to form an input terminal and the first and second drain regions of the two transistors of each set are connected commonly to form an output terminal;

a plurality of non-volatile memory elements for storing the information, which memory elements are formed on the semiconductor substrate spaced-apart from the plural sets of two transistors, the non-volatile memory elements being insulated-gate type elements each including a third source region and a third drain region of said opposite conductivity type and being formed spaced-apart from each other in the semiconductor substrate, a third insulator layer formed on the substrate between the third source region and the third drain region, and a third gate electrode formed on the third insulator layer, the information being written thereinto and being read out therefrom by selecting voltages applied to the third source region, the third drain region and the third gate electrode under the control of the control circuit; and means for suppressing latch-up of a parasitic thyristor formed by the first source region, the first semiconductor region, the substrate, and the second source region, the means for suppressing comprising at least one second semiconductor region of said one conductivity type having an impurity concentration higher than that of the semiconductor substrate, formed between the plural sets of two transistors and the plural non-volatile memory elements in the semiconductor substrate and to which a predetermined voltage is directly applied to cause current generated in the substrate by operation of the non-volatile memory elements to be absorbed at the second semiconductor region.

It is essential that the predetermined voltage, for example a ground voltage or a negative voltage, should be directly applied to the second semiconductor region, in order to have the region act as a drain of the substrate current. Furthermore, the impurity concentraion of the second semiconductor region is desired to be from $1 \times 10^{20}$ cm to $1 \times 10^{22}$ cm$^{-3}$ so as to have a good contact with an electrode to which the predetermined voltage is applied. In connection with these points, the second semiconductor region can be obviously distinguished from a semiconductor region of one conductivity type which is formed conventionally in a semiconductor substrate of one conductivity type, for the purpose of preventing leakage of current from MOS transistors which may be caused by what is called the inversion phenomenon. Namely, the conventional semiconductor region, to which any voltage is not known to be directly applied, ordinarily has an impurity concentration on the order of $10^{17}$ cm$^{-3}$.

The invention will be described in detail with reference to the accompanying drawings.

BRIEF DESCRIPTION OF THE DRAWINGS

FIG. 4 shows a substrate current absorption characteristic of the device shown in FIGS. 1 to 3;

FIG. 5 is a curve which shows a relation between a substrate current $I_{SUB}$ and a source current $I_{DD}$ in a parasitic thyristor according to a conventional integrated circuit device.

DETAILED DESCRIPTION OF THE PREFERRED EMBODIMENTS

The cause of the latch-up phenomenon in integrated circuit devices which comprise plural non-volatile memory elements and plural sets of two complementary insulated-gate type field effect transistors (CMOS devices) formed together on the same semiconductor substrate has been studied. Conventionally, information is stored into an insulated-gate type field effect transistor (a non-volatile memory element) with a SAMOS structure or a MNOS structure according to the following operation. At first, electrons or holes are produced through collision of accelerated carriers with atoms. The electrons or holes are injected into traps existing between a semiconductor substrate and a control electrode of the transistor. Then the traps store the information.

At the same time, a substrate current which has been produced nearby the non-volatile memory elements flows into the CMOS devices. Then the parasitic thyristors of the CMOS devices are turned on, so that the CMOS devices may operate in an errant manner or may actually be broken by an overcurrent.

According to the invention, the substrate current is absorbed through applying a predetermined voltage directly to at least one semiconductor region of one conductivity type, which has an impurity concentration higher than that of the semiconductor substrate and which is formed between the non-volatile memory elements and the CMOS devices. The latch-up phenomenon of the CMOS devices is thereby decreased very much without changing the CMOS structures.

One embodiment of the invention will be described in detail with reference to FIGS. 1 to 3.

Figure 1:
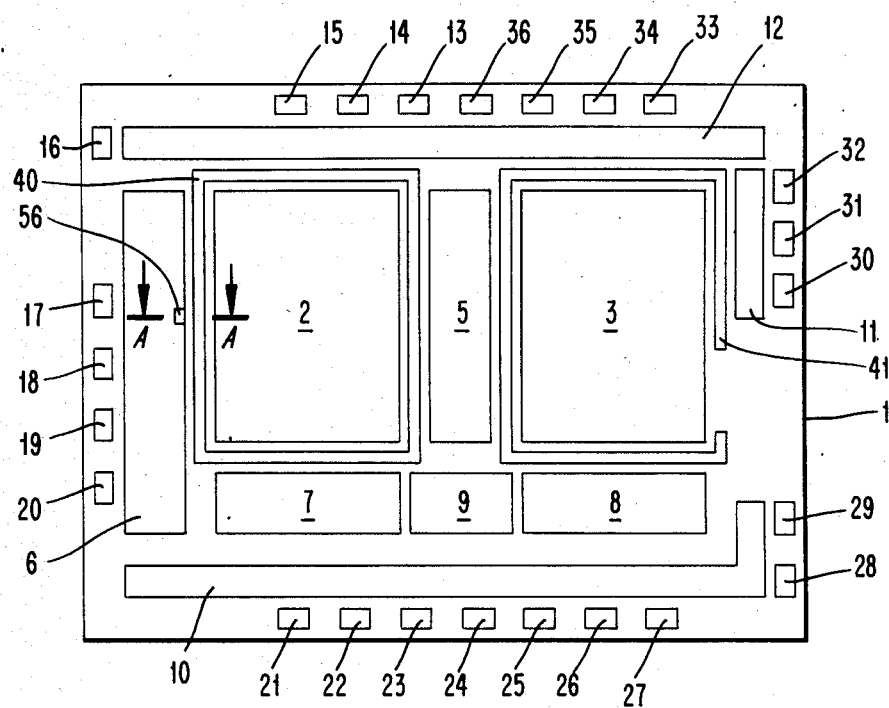
FIG. 1 shows a schematic view of one embodiment of an integrated circuit device according to the invention.
Figure 2:
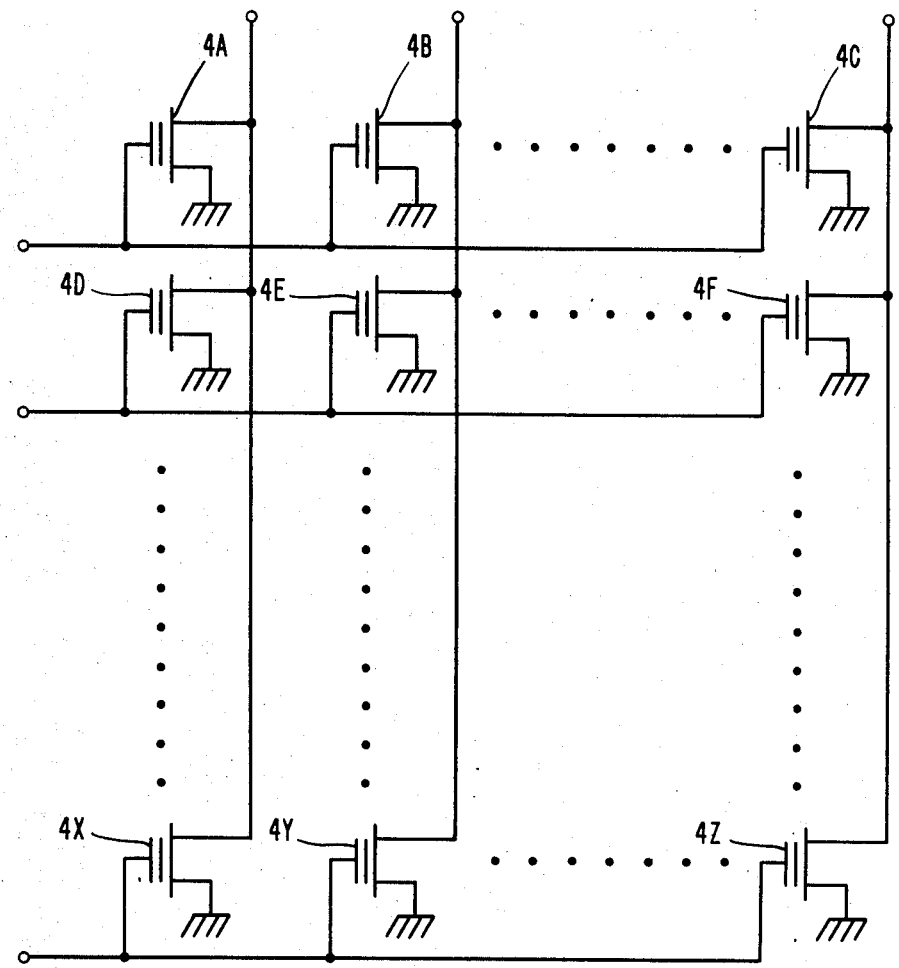
FIG. 2 shows a circuit diagram of a memory array in the device of FIG. 1.

In FIG. 1, memory arrays 2 and 3 are formed on a semiconductor substrate 1 of P conductivity type having a $2 \times 10^{14}$ cm$^{-3}$ impurity concentration. Memory arrays 2 and 3 are made up of insulated-gate field effect transistors of a SAMOS structure. Each memory array 2 and 3 includes four memory blocks, and in each of the memory blocks there is formed, in a matrix, a circuit of insulated-gate field effect transistors (MOS transistors) 4A to 4Z with a SAMOS structure as shown in FIG. 2. Circuits 5 to 12, which are described in more detail below, each includes plural sets of two complementary insulated-gate field effect transistors (CMOS devices). Circuits 5 to 12 are formed around memory arrays 2 and 3 in order to control writing information into transistors 4A to 4Z and reading out the information therefrom.

Furthermore, bonding pads 13 to 36 are formed around the circuits 5 to 12 on insulator films which cover substrate 1. The bonding pads are utilized as power source terminals, input terminals and output terminals. Each of the CMOS devices which constitute circuits 5 to 12 comprises a P-channel type MOS transistor and an N-channel type MOS transistor. A predetermined voltage is applied between the sources of the two transistors. The gates of the two transistors are connected commonly, thereby forming an input terminal. The drains of the two transistors are connected commonly, thereby forming an output terminal.

These CMOS devices work as inverters. Row address signals are sent into a row address buffer circuit 12 through pads 13 to 16 and pads 33 to 35. In circuit 12, the row address signals are converted into driving signals for a row decoder and row selecting circuit 5.

On the other hand, column address signals are sent into a column address buffer circuit 6 through pads 17 to 20. In circuit 6, the column address signals are converted into driving signals for a column decoder circuit 9. Data signals are provided to a data input and output buffer circuit 10 through pads 21 to 23 and pads 25 to 29. This circuit 10 selects each of 8 blocks in the memory arrays 2 and 3 one after another. In a selected block, one of the non-volatile memory transistors is designated by row decoder and row selecting circuit 5 and column selecting circuits 7 and 8, which are controlled by the signals from column decoder circuit 9. Then a "1" or "0" is written into the designated non-volatile memory transistor (or therefrom a "1" or "0" is read out).

Control of writing and reading is carried out by a control circuit 11 which receives control signals from the pads 30 to 32. A power source voltage is applied to the pad 36. A ground voltage is applied to pad 24. Long and narrow regions 40 and 41 are formed in a surface region of the semiconductor substrate 1 around memory arrays 2 and 3. The regions 40 and 41, to which a ground voltage is applied through pad 24, have P-conductivity type and a $4 \times 10^{21}$ cm$^{-3}$ impurity concentration.

Figure 3:
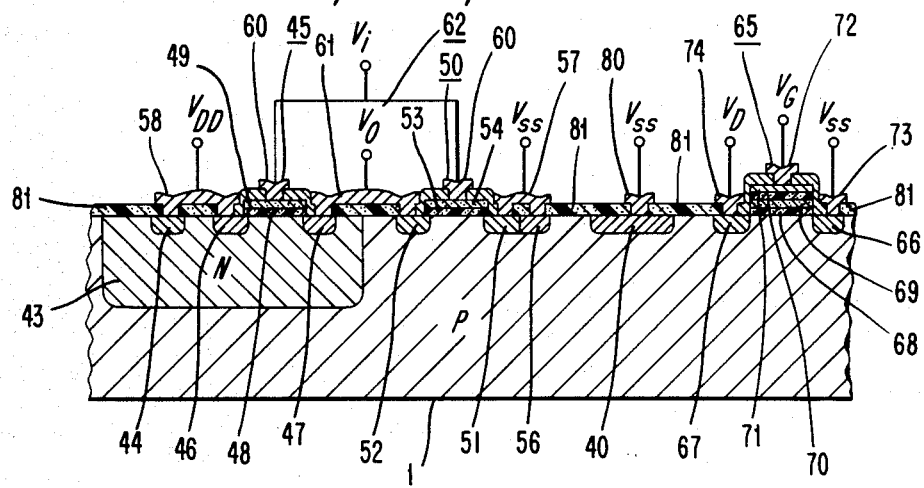
FIG. 3 shows a magnified cross-sectional view taken along line A—A in FIG. 1.

FIG. 3 is a magnified cross-sectional view taken along line A—A in FIG. 1.

In FIG. 3, a well region 43 of N-conductivity type having a $6 \times 10^{15}$ cm$^{-3}$ impurity concentration is formed in the P-type semiconductor substrate 1. In the N-type well region 43, there is formed a N-type region 44 of a $4 \times 10^{21}$ cm$^{-3}$ impurity concentration, a P-type source region 46 and a P-type drain region 47 respectively having a $4 \times 10^{21}$ cm$^{-3}$ impurity concentration, and these regions constituting a P-channel type MOS transistor 45. An insulator film 48 of silicon dioxide is formed between source region 46 and drain region 47 on N-type region 43. Further, a poly-silicon gate electrode 49 is formed on the insulator film 48.

An N-type source region 51 and a N-type drain region 52 having a $4 \times 10^{21}$ cm$^{-3}$ impurity concentration and forming an N-channel type MOS transistor 50, are formed in the P-type surface region of substrate 1. An insulator film 53 of silicon dioxide is formed between source region 51 and drain region 52 on substrate 1. A poly-silicon gate electrode 54 is formed on insulator film 53.

A P-type region 56 of a $4 \times 10^{21}$ cm$^{-3}$ impurity concentration is formed adjoining source region 51 in the N-type surface region of substrate 1. It is not always necessary that region 56 is brought into contact with source region 51. P-type region 56 and N-type source region 51 are connected commonly to an aluminum electrode 57, to which a ground voltage $V_{ss}$ is applied. Substrate 1 is grounded through electrode 57.

N-type region 44 in N-type well region 43 and P-type source region 46 of transistor 45 are connected commonly to an aluminum electrode 58, to which a voltage $V_{DD}$ of $+5$ V is applied. N-type well region 43 is kept at a positive potential through N-type region 44 and electrode 58. Accordingly, the P-N junction between N-type well region 43 and P-type substrate 1 is back-biased, and region 43 and substrate 1 are electrically isolated from each other.

Gate electrodes 49 and 54 of transistors 45 and 50, respectively, are connected commonly to an aluminum electrode 60. Drain regions 47 and 52 of transistors 45 and 50, respectively, are connected commonly to an aluminum electrode 61.

Transistors 45 and 50 form a CMOS device 62. An input signal Vi of CMOS device 62 is provided from electrode 60, and CMOS device 62 operates as an inverter. An output signal $V_O$ of CMOS device 62 is obtained from electrode 61.

An N-type source region 66 and an N-type drain region 67 of a $4 \times 10^{21}$ cm$^{-3}$ impurity concentration, which form an insulatedgate field effect non-volatile memory transistor 65 of a SAMOS structure, are formed spaced-apart from the CMOS device 62 on the surface of substrate 1. An insulator film 68 of silicon dioxide is formed between source region 66 and drain region 67 on substrate 1. A floating-gate electrode 69 of poly-silicon is disposed on insulator film 68. Furthermore, there is formed an insulator film 70 of silicon dioxide on floating-gate electrode 69. A control-gate electrode 71 is formed on insulator film 70.

Control-gate electrode 71 is connected to an aluminum electrode 72, to which a gate-control voltage $V_G$ is applied. Source region 66 is connected to an aluminum electrode 73, to which a ground voltage $V_{ss}$ is applied. Drain region 67 is connected to an aluminum electrode 74, to which a drain-control voltage $V_D$ is applied. When +16 volts are applied to the drain electrode 74 and +20 volts are applied to the control-gate electrode 71, then electrons which have been flowing through a channel are discharged into a depletion layer at a pinch-off point near-by the junction between drain region 67 and substrate 1. These electrons are accelerated by the electric field which exists in the depletion layer and come into collision with atoms constituting substrate 1. Through the collision, the atoms are ionized and simultaneously hot electrons and holes are produced. This phenomenon is called "impact-ionization."

These hot electrons are injected into the floating-gate electrode 69 and/or the boundary face between electrode 69 and insulator film 68 by the electric field between control-gate electrode 71 and substrate 1, where the hot electrons are trapped. Through the above process, a writing operation is performed and a substrate current is formed by the holes which have been produced simultaneously. If a voltage higher than about +16 volts (+20 to +21 volts, for example) is applied to drain electrode 74, an avalanche break-down occurs at the P-N junction between drain region 67 and substrate 1, so that hot electrons and holes are produced. Then, these hot electrons are directly injected into floating-gate electrode 69 and/or the boundary face between electrode 69 and insulator film 68.

In order to read out information from non-volatile memory transistor 65, there should be applied $+2$ volts to drain electrode 74, and $+5$ volts to control-gate electrode 72.

Furthermore, in order to erase information stored in nonvolatile memory transistor 65, ultraviolet rays should be applied to the gate region of transistor 65, or about $-50$ to $-60$ volts should be applied to control-gate electrode 72.

The above-mentioned P-type region 40, by which the invention is characterized, is formed in a surface region of substrate 1 between the non-volatile memory transistor 65 and CMOS device 62. The P-type region 40 has an impurity concentration of $4 \times 10^{21}$ cm$^{-3}$ and is connected to an aluminum electrode 80, to which a ground voltage $V_{ss}$ is applied.

The surface of substrate 1 is covered with an insulator film 81 of silicon dioxide. In insulator film 81, contact holes for electrodes are selectively formed.

An integrated circuit device of the above structure can be fabricated through conventional methods. In the above-mentioned device, holes flow in substrate 1 on the writing operation, and a substrate current $I_{SUB}$ is formed. Most of the substrate current is absorbed into electrode 80 connected to P-type region 40. The rest of the substrate current is injected into P-type region 56 disposed close to transistor 50. This tendency is shown in FIG. 4. In FIG. 4, CURVE 90 shows current absorption values of the electrode 80 and CURVE 91 shows current absorption values of the electrode 57. From these curves it is understood that errant behavior and breakdown of CMOS device 62 are effectively prevented according to the above-mentioned structure.

In this respect, if the P-type region 40 does not exist in the substrate 1, most of the substrate current $I_{SUB}$ produced through the writing operation of non-volatile memory transistor 65 will be injected into P-type region 56. As a result, an electric potential of a region of substrate 1 near P-type region 56 will rise due to the substrate current which flows through a resistance of substrate 1. Then, a P-N junction between N-type source region 51 of transistor 50 and substrate 1 will be forward-biased, so that electrons will be injected from source region 51 through substrate 1 and N-type well region 43 into N-type region 44. Also, a P-N junction between N-type well region 43 and source region 46 will be forward-biased, so that holes will be injected from source region 46 through the N-type well region 43 and P-type substrate 1 into the N-type source region 51. In this way, a great value of current will begin to flow between electrodes 58 and 57 on account of the positive feedback effect of a parasitic thyristor, which has a PNPN structure comprising P-type source region 46 of transistor 45, N-type well region 43, P-type substrate 1 and N-type source region 51 of transistor 50. Once the parasitic thyristor is turned on and a great value of current begins to flow, the current will continue to flow unchanged even if the cause, that is to say the substrate current, is removed.

The latch-up phenomenon is caused only under the condition that a substrate current flows in the substrate and independently of whether or not P-type region 56 exists around the CMOS device 62.

FIG. 5 shows a relation between substrate current values $I_{SUB}$ and current values $I_{DD}$ of the current which flows into source electrode 58 in accordance with a conventional device, wherein P-type region 40 does not exist in substrate 1. From the curve in FIG. 5 it is well understood that when the substrate current $I_{SUB}$ comes to have a value greater than 1.12 mA, the parasitic thyristor is turned on and current $I_{DD}$ increases abruptly.

In the above-mentioned embodiment, it is possible that a negative voltage is adopted as a voltage to be applied to P-type region 40. In this case, a substrate current can be effectively absorbed, compared with the case wherein a ground voltage is applied to P-type region 40. In the above-mentioned embodiment, the P-type region of a high impurity concentration for substrate current absorption is allowed to have a shape similar to a loop with a crack as shown with a reference mark "41" in FIG. 1.

What is claimed is:

1. An integrated circuit device for writing and reading information comprising:
    a semiconductor substrate of one conductivity type having at least one first semiconductor region of opposite conductivity type;
    plural sets of two complementary insulated-gate type field effect transistors which constitute a control circuit for writing and reading information, one of the two transistors of each of the sets being of said one conductivity channel type including a first source region and a first drain region of said one conductivity type and formed spaced-apart from each other in said first semiconductor region, a first insulator layer formed on the first semiconductor region between said first source region and said first drain region, and a first gate electrode formed on said first insulator layer, the other of the two transistors of each of the sets being of said opposite conductivity channel type including a second source region and a second drain region of the opposite conductivity type, formed spaced-apart from each other in said semiconductor substrate, a second insulator layer formed on said substrate between said second source region and said second drain region, and a second gate electrode formed on said second insulator layer; wherein a predetermined voltage is applied between said first and second source regions of said two transistors of each set, the first and second gate electrodes are connected commonly to form an input terminal, and said first and second drain regions of said two transistors of each set are connected commonly to form an output terminal;
    a plurality of non-volatile memory elements for storing said information, which memory elements are formed and arranged like a matrix on said semiconductor substrate spaced-apart from said plural sets of two transistors, said non-volatile memory elements being insulated-gate type elements each including a third source region and a third drain region of said opposite conductivity type and being formed spaced-apart from each other in said semiconductor substrate, a third insulator layer formed on said substrate between said third source region and said third drain region, and a third gate electrode formed on said third insulator layer; the information being read out therefrom and being written thereinto by selecting voltages applied to said third source region, said third drain region and said third gate electrode under the control of said control circuit;
    a second semiconductor region of said one conductivity type and of a higher impurity concentration than that of said semiconductor substrate, formed near at least one of said field effect transistors of said opposite conductivity channel type, and to which second semiconductor region at a predetermined voltage is applied; and
    means for suppressing latch-up of a parasitic thyristor formed by said first source region, said first semiconductor region, said substrate, and said second source region as a result of introducing charges into the gate regions of said non-volatile memory elements produced through impact ionization, said means for suppressing comprising a third semiconductor region of said one conductivity type, having an impurity concentration higher than that of the semiconductor substrate and formed surrounding said plurality of non-volatile memory elements in the semiconductor substrate and spaced-apart from the drain regions thereof, and also spaced-apart from both said plural sets of two transistors and from said second semiconductor region, and to which third semiconductor region a predetermined voltage is directly applied to cause current generated in said substrate by operation of said memory elements to be absorbed at said third semiconductor region.

2. The integrated circuit device for writing and reading information according to claim 1, wherein each of the non-volatile memory elements further comprises a floating-gate electrode formed on said third insulator layer, and a fourth insulator layer is placed between said floating-gate electrode and said third gate electrode;

and wherein a writing operation is carried out by introducing into the gate regions of said memory elements charges which have been produced through impact ionization.

3. The integrated circuit device for writing and reading information according to claim 1, wherein said semiconductor substrate has P conductivity type and a ground or negative voltage is applied to said third semiconductor region.

4. The integrated circuit device for writing and reading information according to claim 1, wherein said second semiconductor region is grounded.

* * * * *